(12) United States Patent
Hellmich et al.

(10) Patent No.: US 7,381,622 B2
(45) Date of Patent: Jun. 3, 2008

(54) METHOD FOR FORMING EMBEDDED STRAINED DRAIN/SOURCE REGIONS BASED ON A COMBINED SPACER AND CAVITY ETCH PROCESS

(75) Inventors: Andreas Hellmich, Dresden (DE);
Gunter Grasshoff, Radebeul (DE);
Fernando Koch, Bitterfeld (DE); Andy Wei, Dresden (DE); Thorsten Kammler, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 63 days.

(21) Appl. No.: 11/559,462

(22) Filed: Nov. 14, 2006

(65) Prior Publication Data

US 2007/0232006 A1  Oct. 4, 2007

(30) Foreign Application Priority Data

Mar. 31, 2006 (DE) .................. 10 2006 015 087

(51) Int. Cl.
*H01L 21/338* (2006.01)
*H01L 21/8238* (2006.01)
*H01L 21/336* (2006.01)
*H01L 21/461* (2006.01)
*H01L 21/302* (2006.01)

(52) U.S. Cl. .............. 438/300; 438/184; 438/222; 438/689; 438/734; 257/E21.252; 257/E21.256

(58) Field of Classification Search .......... 438/184, 438/222, 300, 689, 734; 257/E21.252, E21.256
See application file for complete search history.

(56) References Cited

U.S. PATENT DOCUMENTS

| | | | | |
|---|---|---|---|---|
| 6,472,276 B1 * | 10/2002 | Hilt et al. | ............... | 438/285 |
| 6,579,809 B1 * | 6/2003 | Yang et al. | ............... | 438/734 |
| 6,960,781 B2 * | 11/2005 | Currie et al. | ............... | 257/19 |
| 7,297,612 B2 * | 11/2007 | Langdo et al. | ............... | 438/458 |
| 7,307,273 B2 * | 12/2007 | Currie | ............... | 257/18 |

* cited by examiner

*Primary Examiner*—Michael S. Lebentritt
*Assistant Examiner*—Mohsen Ahmadi
(74) *Attorney, Agent, or Firm*—Williams, Morgan & Amerson, P.C.

(57) ABSTRACT

By patterning a spacer layer stack and etching a cavity in an in situ etch process, the process complexity, as well as the uniformity, during the formation of embedded strained semiconductor layers may be significantly enhanced. In an initial phase, the spacer layer stack may be patterned on the basis of an anisotropic etch step with a high degree of uniformity, since a selectivity between individual stack layers may not be necessary. Thereafter, a cleaning process may be performed followed by a cavity etch process, wherein a reduced over-etch time during the spacer patterning process significantly contributes to the uniformity of the finally obtained cavities, while the in situ nature of the process also provides a reduced overall process time.

19 Claims, 9 Drawing Sheets

METHOD FOR FORMING EMBEDDED STRAINED DRAIN/SOURCE REGIONS BASED ON A COMBINED SPACER AND CAVITY ETCH PROCESS

BACKGROUND OF THE INVENTION

1. Field of the Invention

Generally, the present invention relates to the formation of integrated circuits, and, more particularly, to the formation of source/drain regions of transistors by using an embedded strained semiconductor material to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. Among others, the development or sophisticated adaptation of enhanced photolithography techniques, implantation processes, deposition techniques, etch processes and many other processes may be necessary with the advance to every new technology node.

Therefore, it has been proposed to also enhance the channel conductivity of the transistor elements by increasing the charge carrier mobility in the channel region for a given channel length, thereby offering the potential for achieving a performance improvement that is comparable with the advance to an advanced technology node while avoiding or at least postponing many of the above process developments and adaptations associated with device scaling. One efficient mechanism for increasing the charge carrier mobility is the modification of the lattice structure in the channel region by, for instance, producing a corresponding strain in the channel region, which results in a modified mobility for electrons and holes, respectively. For example, creating tensile strain in the channel region increases the mobility of electrons, which, in turn, may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for future device generations since, for example, strained silicon may be considered as a "new" type of semiconductor material, which may enable the fabrication of fast powerful semiconductor devices without requiring expensive semiconductor materials and manufacturing techniques.

In one approach, the hole mobility of PMOS transistors is enhanced by forming an embedded strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked and subsequently the silicon/germanium layer is selectively formed in the PMOS transistor by epitaxial growth. Although this technique offers significant advantages in view of performance gain of the PMOS transistor and thus of the entire CMOS device, the corresponding process flow for forming the recesses and the respective etch and growth mask for covering the NMOS transistor may comprises a plurality of complex process steps, as will now described in more detail with reference to FIGS. 1a-1d.

FIG. 1a schematically illustrates a cross-sectional view of a semiconductor device 100 comprising a P-channel transistor 150p and an N-channel transistor 150n, which may be formed above a substrate 101 at appropriate substrate areas. In this manufacturing stage, the transistors 150p, 150n may each comprise a gate electrode 105 formed above a semiconductor layer 102 and separated therefrom by a gate insulation layer 104. Moreover, the respective gate electrodes may be covered by a capping layer 109, which is typically comprised of silicon nitride. As previously explained, the transistors 150p, 150n may represent field effect transistors of highly scaled semiconductor devices, wherein a gate length, i.e., the horizontal extension of the gate electrodes 105 in FIG. 1a, may be approximately 100 nm and significantly less. Consequently, in order to obtain an enhanced performance for the P-channel transistor 150p for a given gate length, strain may be created in the respective channel region 103 based on an embedded strained semiconductor layer to be formed adjacent to the gate electrode 105 of the P-channel transistor 150p, as will be described later on.

Typically, the semiconductor device 100 as shown in FIG. 1a may be formed according to the following processes. After forming a dielectric material for the gate insulation layers 104 by oxidation and/or deposition and after the deposition of an appropriate gate electrode material, such as polysilicon, an advanced patterning process on the basis of photolithography and anisotropic etch techniques may be performed to obtain the gate electrodes 105 as shown. In order to provide reliable encapsulation of the gate electrodes

105 during the further processing, an appropriate capping layer is usually deposited prior to the patterning of the gate electrodes 105, wherein a thickness of the corresponding capping layer may be selected such that an appropriate process margin is provided for the subsequent processing, that is, during the subsequent etch and epitaxial growth processes. Consequently, the capping layers 109 are provided on top of the gate electrodes 105 with a thickness corresponding to the process requirements, wherein, however, the thickness of the capping layers 109 may also be selected in accordance with requirements of the preceding patterning process, thereby also restricting the available range of thickness for the capping layers 109.

FIG. 1b schematically illustrates the semiconductor device 100 in a further advanced manufacturing stage. A spacer layer stack comprising a silicon dioxide liner 107 and a silicon nitride spacer layer 106 is conformally formed above the first and second transistors 150p, 150n. Moreover, a resist mask 108 is formed above the N-channel transistor 150n, while exposing the P-channel transistor 150p.

The liner 107 and the spacer layer 106 may be formed on the basis of well-established techniques, such as plasma enhanced chemical vapor deposition (PECVD) or low pressure chemical vapor deposition (LPCVD) and the like. During the formation of the liner 107, which will act as an etch stop layer during an anisotropic etch process 110 for patterning the spacer layer 106, an appropriate thickness of the layer 107 is selected with respect to a reliable protection of the capping layers 109 and the semiconductor layer 102 during a respective extended over-etch time of the process 110, which may be required due to pattern dependent etch non-uniformities, which may also be referred to as microloading effects. Consequently, the initial thickness of the silicon dioxide liner 107 is selected in a range of approximately 10-20 nm in order to provide the required protection of the underlying materials during the anisotropic etch process 110. Thereafter, the spacer layer 106, comprised of silicon nitride, may be deposited on the basis of LPCVD and the like, with a thickness required for reliably encapsulating the second transistor 150n during a subsequent selective epitaxial growth process and also to define a specific offset for a cavity etch in the P-channel transistor 150p. Thereafter, the resist layer 108 may be formed on the basis of well-established photolithography techniques. Then, the device 100 is subjected to the anisotropic etch process 110 in order to form respective sidewall spacers on the gate electrode 105 of the P-channel transistor 150p to provide the required encapsulation for the subsequent selective epitaxial growth process. During the etch process 110, using appropriate process parameters, a highly anisotropic behavior of the etch process 110 may be obtained, for instance on the basis of fluorine-containing reactive components in combination with a specific plasma ambient, while a high etch selectivity with respect to the material of the liner 107 is simultaneously achieved. The pronounced selectivity of the etch process 110 may, however, be associated with a certain degree of non-uniformity and sensitivity to pattern density of circuit elements formed across the entire substrate 101, thereby resulting in a moderately non-uniform etch result. Consequently, a certain amount of over-etch time in the process 110 is applied in order to reliably expose the liner 107 across the entire substrate 101. At the same time, exposure of the semiconductor layer 102 and/or the capping layers 109 is to be maintained at a low level in order to not unduly affect the uniformity of the subsequent cavity etch process. Thus, a more or less reduced uniformity of the oxide liner 107 after the completion of the etch process 110 may therefore also affect the finally obtained etch result in the subsequent cavity etch process. Additionally, the characteristics of the respective spacers formed during the anisotropic etch process 110, i.e., their finally obtained width as well as the degree of coverage of the sidewalls of the gate electrode 105, may also be affected by the required over-etch time and thus the thickness of the spacer layer 106 and also the capping layers 109 may not be selected independently from each other, but may have to be selected on the basis of the requirement for efficient protection during the subsequent processing.

FIG. 1c schematically illustrates the semiconductor device 100 after the completion of the above-described process sequence and after a further plasma-based resist strip etch process for removing the resist mask 108. Hence, the device 100 comprises respective spacer elements 106A, including the liner 107 formed on sidewalls of the gate electrode of the P-channel transistor 150p, while the N-channel transistor 150n is still covered by the liner 107 and the spacer layer 106. As explained above, a respective spacer width 106W as well as a residual thickness 107T of the liner 107 after the etch process 110 may depend on the specifics of the etch process and may vary due to the above-explained etch non-uniformities. Thereafter, the device 100 is subjected to a further etch process for removing the exposed portions of the residues of the liner 107, which may have a significantly reduced thickness, i.e., the thickness 107T, compared to the initial thickness, which may be accomplished on the basis of high frequency plasma-based techniques. Thereafter, the device 100 may be subjected to a cleaning process on the basis of an appropriate wet chemical chemistry for efficiently removing any contaminants resulting from the previous process steps. Any contaminants or surface irregularities, caused by the preceding etch processes, may otherwise significantly influence the subsequent cavity etch process, thereby resulting in non-uniformities, which may then also translate into respective non-uniformities during a subsequent selective epitaxial growth process.

FIG. 1d schematically illustrates the device 100 after the completion of the above-described process sequence, wherein here the device 100 is exposed to a further etch process 112 for forming a respective recess or cavity 111 adjacent to the gate electrode 105 on the basis of the sidewall spacers 106A. The etch process 112 may be designed as an isotropic etch process, an anisotropic etch process or as any mixture thereof, depending on the desired size and shape of the recess 111. Due to any process non-uniformities, especially during the etch process 110 for patterning the sidewall spacers 106A, the etch process 112 may also result in corresponding etch non-uniformities, i.e., the depth of the cavity 111 as well as the resulting surface roughness may vary across the substrate 101. Since the etch process 112 and thus the finally obtained depth and shape of the recess 111 may be controlled for a given etch recipe on the basis of the etch time only, any previously produced non-uniformities may significantly determine the finally obtained across-substrate uniformity in addition to any further process non-uniformities of the cavity etch process 112 itself.

After the etch process 112 and after any cleaning processes for removing contaminants from exposed portions of the semiconductor layer 102, a corresponding selective epitaxial growth process may be performed on the basis of established recipes in order to provide a strained semiconductor material in the recess 111, for instance a silicon/germanium layer, thereby providing a desired degree of strain in the adjacent channel region 103. However, any non-uniformities of the respective recesses 111 may thus also translate into respective non-uniformities of the generated strain, since the shape and depth of the recess 111 and thus the amount of strained semiconductor material and its location may be determined by the configuration of the recess 111. As a consequence, a corresponding nonuniformity of transistor characteristics may result. Thus, a plurality of highly complex process steps are required while the requirements for enhanced device performance uniformity may significantly affect process flexibility with respect to the characteristics of the recess 111.

In view of the situation described above, there exists a need for an improved technique for the formation of recesses in advanced transistor elements while avoiding or at least reducing one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique which provides enhanced process flexibility, less complexity and enhanced uniformity during the formation of recesses or cavities adjacent to gate electrodes of field effect transistors in which appropriate strained semiconductor layers may be formed on the basis of selective epitaxial growth techniques. For this purpose, the etch process for patterning sidewall spacers may be performed on the basis of an etch ambient having increased across-substrate uniformity due to, for instance, significantly reduced constraints with respect to selectivity required for etching a corresponding spacer layer stack. As substantially no selectivity for the spacer layer stack may be required, at least the respective sidewall spacers may be patterned in a single common etch process, thereby providing enhanced process flexibility with respect to the formation of a liner material of the spacer layer stack. In other illustrative embodiments, the process for patterning respective sidewall spacers and etching a recess or cavity adjacent to a gate electrode may be performed as an in situ process, i.e., within a single process chamber, thereby significantly relaxing constraints imposed on the patterning process while nevertheless obtaining a significantly enhanced process uniformity.

According to one illustrative embodiment of the present invention, a method comprises forming a spacer layer above a semiconductor layer so as to cover a gate electrode of a transistor, wherein the gate electrode is formed above the semiconductor layer and has formed on a top surface thereof a capping layer. The method further comprises performing an in situ etch process for etching the spacer layer and the semiconductor layer to form sidewall spacers on sidewalls of the gate electrode and a recess in the semiconductor layer adjacent to the sidewall spacers. Finally, a strained semiconductor material is formed in the recess.

According to another illustrative embodiment of the present invention, a method comprises forming a first recess and a first sidewall spacer adjacent to a gate electrode of a first transistor of a first type by a first in situ etch process. Furthermore, a second recess and a second sidewall spacer are formed adjacent to a second gate electrode of a second transistor of a second type that is different from the first type. Furthermore, a first semiconductor material is formed in the first recess and a second semiconductor material is formed in the second recess.

According to yet another illustrative embodiment of the present invention, a method comprises forming a spacer layer stack including at least two different material layers above a semiconductor layer so as to cover a gate electrode of a transistor, wherein the gate electrode is formed above the semiconductor layer and has formed on a top surface thereof a capping layer. The method further comprises forming a sidewall spacer on a sidewall of the gate electrode by etching the spacer layer stack in a common anisotropic etch process based on a first plasma-based etch ambient. The method further comprises forming a recess adjacent to the gate electrode on the basis of the sidewall spacer and forming a strained semiconductor material in the recess.

BRIEF DESCRIPTION OF THE DRAWINGS

The invention may be understood by reference to the following description taken in conjunction with the accompanying drawings, in which like reference numerals identify like elements, and in which.

Figure 1A:
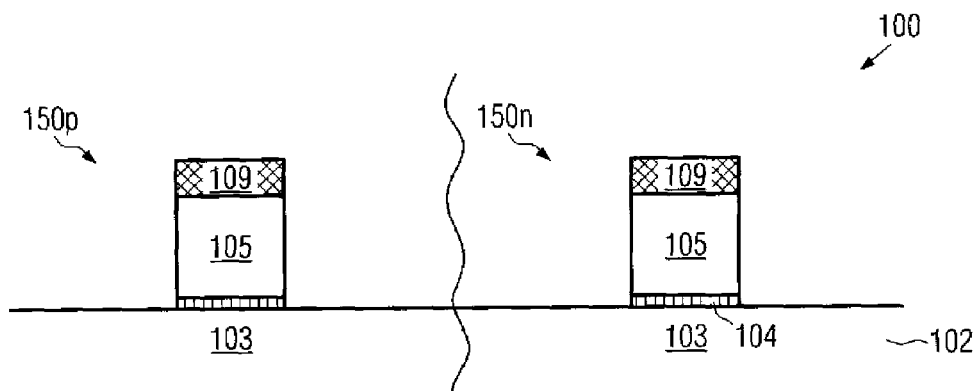
FIGS. 1a-1d schematically illustrate cross-sectional views of a semiconductor device at various manufacturing stages during the formation of a recess for receiving a strained silicon/germanium material therein in accordance with conventional process techniques.
Figure 1B:
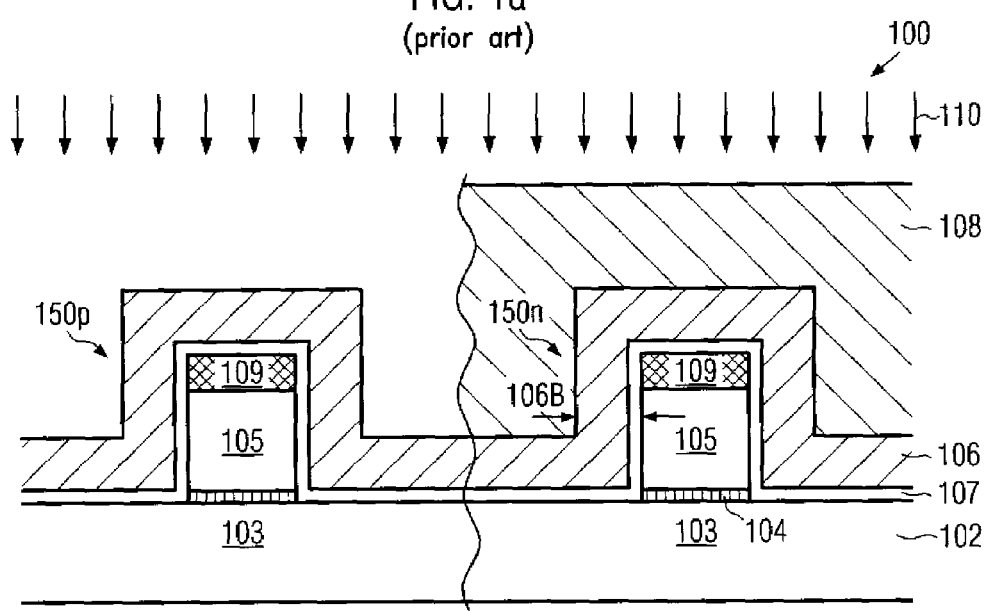
Figure 1C:
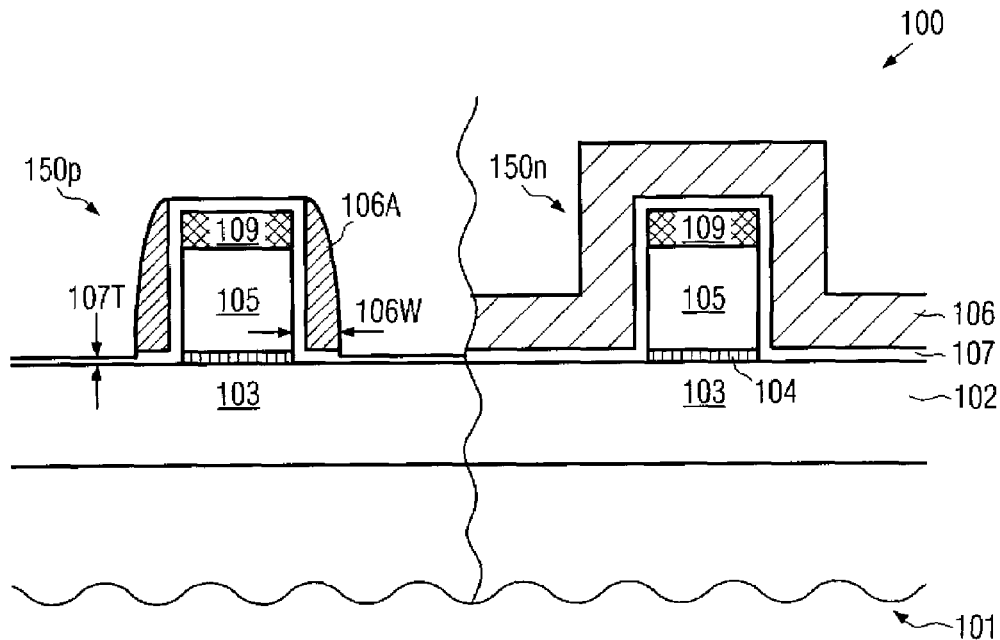
Figure 1D:
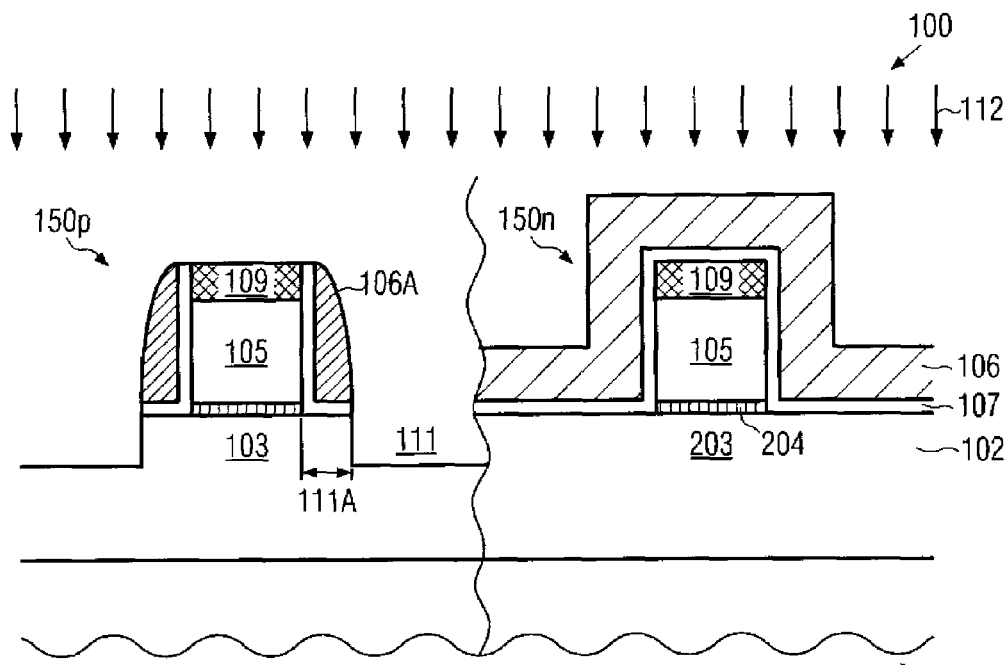

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for the formation of a strained semiconductor material adjacent to respective gate electrodes, wherein, during the patterning of corresponding recesses or cavities, at least the process for forming respective sidewall spacers is performed on the basis of a highly uniform etch process substantially without a pronounced selectivity between different material layers in the spacer layer so that at least the sidewall spacers may be patterned in situ, thereby exposing the respective semiconductor material adjacent to the sidewall spacers. In this respect, an etch process may be considered as an in situ process when the process result is obtained without any intermediate substrate handling activities, such as transportation to a different etch chamber and the like. Consequently, when referring to an in situ etch process, it is to be understood that the respective substrate may be positioned in any appropriate environment, such as an etch chamber and the like, wherein a corresponding etch ambient may be established which may change during the etch process, while the substrate maintains its position until the respective etch process is completed. Thus, according to the present invention, at least the patterning of respective sidewall spacers, including the exposure of relevant portions of the underlying semiconductor layer, may be accomplished on the basis of an in situ process, which may therefore be designed so as to exhibit a high etch uniformity across the entire substrate, since a pronounced selectivity with respect to a liner material may not be required.

In other illustrative embodiments, both the patterning of the sidewall spacers and the formation of a respective recess or cavity adjacent to the sidewall spacers in a respective semiconductor material may be accomplished on the basis of an in situ etch process, thereby enhancing even more the overall process uniformity and also the process flexibility, for instance with respect to controlling the size and/or the shape of the respective recess. Furthermore, the overall process complexity compared to the prior art processing, as previously described with reference to FIGS. 1a-1d, may be reduced, thereby also improving the cycle time and thus the process tool utilization. In still other illustrative embodiments, the highly efficient in situ process may be applied to the formation of differently strained semiconductor layers for different transistor types, thereby providing significantly reduced process complexity while nevertheless providing the advantages of increased device performance, enhanced process flexibility and reduced production costs.

It should be appreciated that the present invention is highly advantageous in the context of the formation of strained semiconductor materials adjacent to respective gate electrodes, since here a significant gain in performance may be accomplished, as is previously explained. Nevertheless, the principles of the present invention may also be advantageously applied in cases in which a semiconductor material of different characteristics is to be formed on the basis of selective epitaxial growth techniques in order to provide specific device characteristics. For instance, the incorporation of dopant material by selective growth techniques, the formation of moderately deep trenches extending through a buried insulating layer and the like may be accomplished on the basis of the present invention with reduced process complexity, as is described above.

Figure 2A:
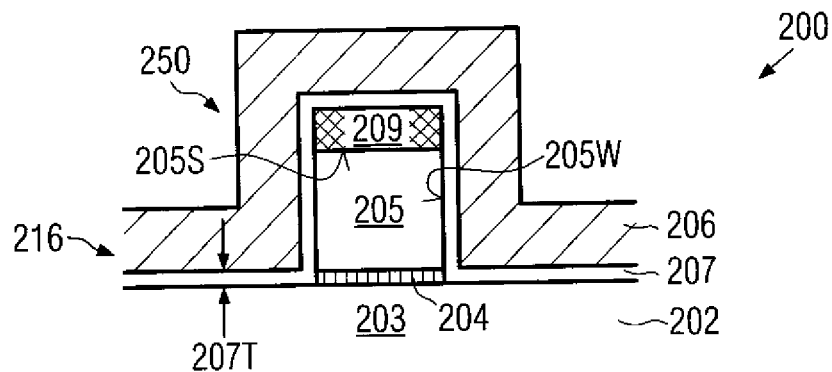
FIGS. 2a-2d schematically illustrate cross-sectional views of a transistor device during the formation of a recess for receiving strained semiconductor material therein on the basis of an in situ patterning process according to illustrative embodiments of the present invention.

With reference to the accompanying figures, further illustrative embodiments of the present invention will now be described in more detail. FIG. 2a schematically illustrates in a cross-sectional view a semiconductor device 200 comprising a transistor 250, which is formed in or above a substrate 201. The substrate 201 may represent any appropriate substrate, such as a bulk silicon substrate, a silicon-on-insulator (SOI) substrate and the like. Also depicted is a semiconductor layer 202 which may be comprised of any type of semiconductive material. In one illustrative embodiment, the semiconductor layer 202 may be a silicon-based layer, that is, a layer having an amount of approximately 50 atomic percent or more of silicon that is formed on the substrate 201 wherein a buried insulating layer (not shown) may be provided when an SOI configuration is considered. The transistor 250, which may represent a P-channel transistor or an N-channel transistor, may comprise in this manufacturing stage a gate electrode 205 formed above a channel region 203 located in the semiconductor layer 202 and separated from the gate electrode 205 by a gate insulation layer 204. Moreover, a capping layer 209 may be formed on a top surface of the gate electrode 205, wherein the capping layer 209 may be comprised of any appropriate material, such as silicon nitride. Moreover, a spacer layer 216, which may be provided in the form of a layer stack including a liner 207, for instance comprised of silicon dioxide, and a spacer layer 206, comprised of, for instance, silicon nitride, is formed above the device 200 so as to enclose the transistor 250. In some illustrative embodiments, the liner 207 may be provided with a specified thickness 207T, which may range from approximately 3-10 nm, since the thickness 207T may be selected on the basis of process requirements for maintaining the integrity of sidewalls 205W of the gate electrode 205 rather than with respect to an etch process for patterning the spacer layer 216 in a subsequent etch process. Consequently, the liner 207 may have a significantly reduced thickness compared to conventional techniques, thereby enabling an increase of device performance, since a respective cavity to be etched adjacent to the gate electrode 205 may be sufficient with a reduced offset due to the reduced thickness 207T. In some illustrative embodiments, the liner 207 may be omitted when the integrity of the sidewalls 205W during the subsequent processing may not be compromised. In one embodiment, the liner 207 may be formed on horizontal portions of the semiconductor layer 202 and the sidewalls 205W only, for instance when an oxidation process may be performed rather than depositing the liner 207.

The device 200 as shown in FIG. 2a may be formed on the basis of the following processes. After forming a material layer for the gate insulation layer 204 and the gate electrode 205, a corresponding capping material may be deposited, wherein selection of an appropriate thickness of the capping material may be less critical due to a reduced exposure of the capping layer 209 to an etch ambient in subsequent etch processes. Thereafter, the corresponding layer stack may be patterned on the basis of well-established techniques, as is previously described with reference to the device 100. Next, the spacer layer 216 may be formed, wherein, in some illustrative embodiments, the liner 207 may be deposited on the basis of well-established chemical vapor deposition (CVD) techniques. In still other embodiments, additionally or alternatively, an oxidation process may be performed to form a highly conformal silicon dioxide layer with a reduced thickness 207T in a highly controllable fashion. Thereafter, the spacer layer 206 may be formed, for instance on the basis of low pressure chemical vapor deposition (LPCVD), plasma enhanced chemical vapor deposition (PECVD) and the like. For example, for advanced applications, a thickness of the spacer layer 206 may range from approximately 5-50 nm.

Figure 2B:
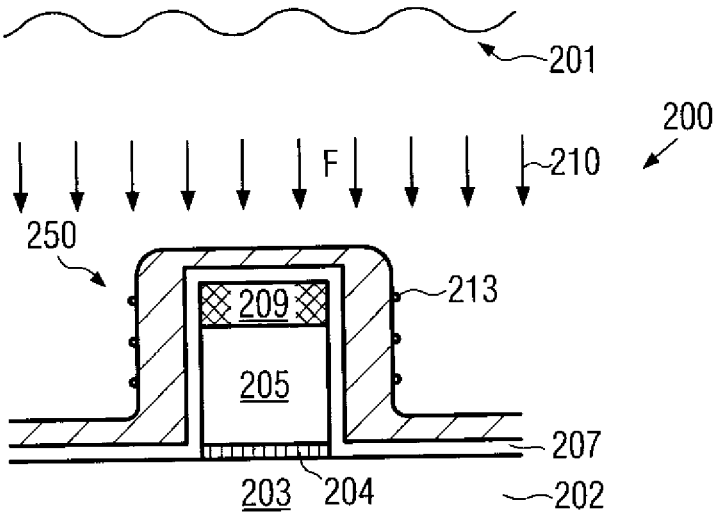

FIG. 2b schematically illustrates the semiconductor device 200 in a further advanced manufacturing stage, in which the device 200 is exposed to an etch process 210 for patterning the spacer layer 216 into respective sidewall spacers. As previously explained, the etch process 210 may, at least in a phase for patterning the spacer layer 216, be designed as an anisotropic etch process wherein a pronounced selectivity with respect to the materials of the layers 206 and 207 may not be required. Consequently, the etch ambient for this phase of the etch process 210 may be selected in view of high etch uniformity, i.e., reduced dependence on pattern density and the like, rather than adjusting the respective etch chemistry so as to obtain a high degree of selectivity between the layers 206 and 207, as is the case in the conventional technique. For instance, a fluorine-based chemistry may be used in combination with any appropriate precursor materials that may form respective intermediate compounds at sidewalls of the topography of the transistor 250, thereby significantly reducing an etch attack in the horizontal direction. For example, respective polymer materials may be introduced into the etch ambient of the process 210 in this phase, which may therefore form a certain passivation layer 213 preferable at vertical layer portions. Moreover, by appropriately selecting plasma parameters for the ambient, for instance on the basis of appropriately selected bias and radio frequency powers, the directionality of the respective reactive species may further enhance the anisotropic character of the etch process 210 in this phase. Consequently, a highly uniform material removal of horizontal portions of the layer 206 and subsequently of the layer 207 may be achieved, while a high degree of uniformity for respective spacer elements may also be accomplished.

Figure 2C:
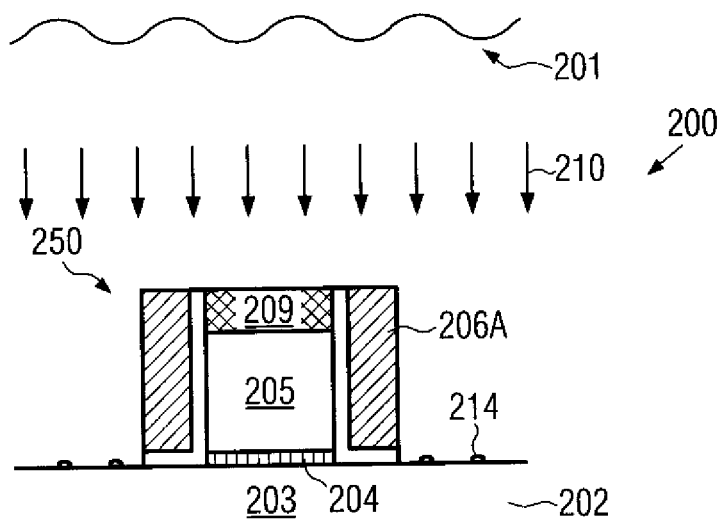

FIG. 2c schematically illustrates the device 200 in a further advanced stage of the etch process 210, i.e., in the phase for forming sidewall spacers 206A on the basis of an anisotropic etch ambient of increased uniformity. As previously explained, the materials of the layers 207 and 206 may be removed with similar removal rates and thus finally the semiconductor layer 202 and the capping layer 209 may be substantially uniformly exposed, which may be detected, for instance, on the basis of an appropriately designed endpoint detection or by any other optical measurement techniques as are well-established in the art. Due to the increased uniformity of the etch process 210 for patterning the sidewall spacers 206A, the process may be reliably stopped on and in the semiconductor layer 202 without undue exposure to the etch ambient, i.e., an undue over-etch time may not be required, contrary to the conventional case, thereby reducing any negative impact of the etch process 210 on the capping layer 209 and the exposed semiconductor layer 202.

It should be appreciated that, in some illustrative embodiments, as will be described later on in more detail, other device areas of the device 200 may be covered by a resist mask during a phase of the etch process 210 for patterning the sidewall spacers 206A, and, hence, in some illustrative embodiments, the corresponding resist mask may be removed by correspondingly changing the respective etch chemistry of the process 210, for instance on the basis of an oxygen-based plasma process, wherein a corresponding fluorine content may be obtained from any polymers which may have been deposited during the first phase of the process 210 for patterning the spacers 206A. Consequently, during the optional resist removal on the basis of a corresponding oxygen-based plasma process, the deposition of unwanted polymer material on chamber walls and the like may be significantly reduced, while at the same time enhancing the efficiency of the resist removal process. Thus, in some illustrative embodiments, the process 210 for patterning the sidewall spacer 206A, as well as the optional resist removal process, may be performed as an in situ process. Thereafter, an appropriately designed cleaning process may be performed which may, in some embodiments, be performed during the etch process 210, for instance on the basis of an appropriate etch chemistry so as to remove contaminants 214 from exposed portions of the semiconductor layer 202. For example, an oxygen-based plasma ambient may be established in order to efficiently remove the contaminants 214.

Figure 2D:
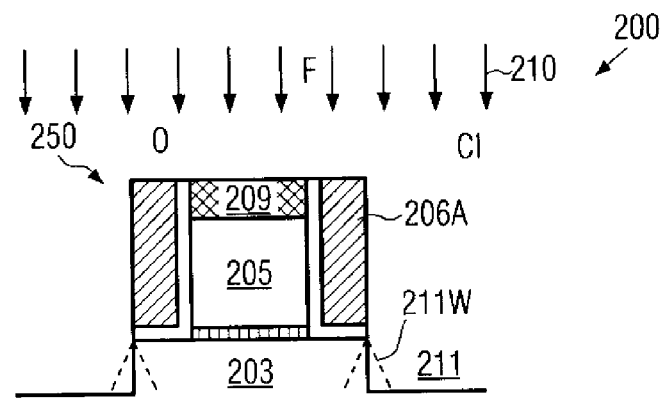

FIG. 2d schematically illustrates the device 200 in a further advanced manufacturing stage for forming respective cavities or recesses 211 adjacent to the gate electrode 205 and the channel region 203 on the basis of the sidewall spacers 206A. In one illustrative embodiment, the corresponding etch process for forming the cavities 211 is performed in situ with the previous processes and hence the corresponding etch process 210 may be continued on the basis of an appropriately established etch ambient so as to provide the desired etch characteristics for the formation of the recesses 211. For instance, a halide-based etch chemistry, for instance comprising fluorine radicals, may be used for the etch process 210 in this phase, wherein, depending on the desired degree of anisotropy of the process 210 in this phase, additional passivation generators, such as polymer precursors, may be used to provide a respective passivation layer for reducing a horizontal attack of the etch ambient. For instance, similar materials may be used as during the initial phase of the etch process 210 when patterning the spacer layer 216. That is, for instance, oxygen-based or chlorine-based polymer precursor materials may be introduced in order to control the degree of passivation obtained in the horizontal direction. Moreover, the density, directionality and energy of the reactive ions, such as fluorine radicals, within the etch ambient of the process 210 in this phase may be controlled for adjusting a specified degree of anisotropy. For example, respective plasma-based etch tools are available in the art which enable the creation of an appropriate plasma-based etch ambient wherein, for instance, on the basis of the bias power, i.e., an acceleration potential for directing respective ions towards the substrate 201 may be used wherein, additionally, respective pressure settings may be adjusted in order to appropriately control the ion flux density in the ambient of the process 210. Consequently, by appropriately controlling the amount of passivation generators, i.e., of precursor gases resulting in the formation of a passivation layer, which may be effectively removed by ion bombardment at horizontal portions of the device 200, accomplished on the basis of adjusting the ratio of reactive components and passivation generators, in combination with selecting appropriate ion flux densities during the process 210, the degree of isotropy or anisotropy during the formation of the recess 211 may be controlled. Respective process parameters may be readily selected for a given chamber configuration of a process tool under consideration on the basis of respective test runs. For example, as indicated at 211W, various shapes of wall of the cavity 211 are illustrated, which may be obtained on the basis of a respective control of the characteristics of the etch process 210 at this phase of the process, that is, the degree of anisotropy may be varied, or other process parameters, such as polymer precursors, the ion flux density, ion energy and the like, may be controlled to obtain a desired shape of the sidewalls 211W. It should be appreciated that the shapes of the sidewalls 211W are only of illustrative nature. Moreover, the finally obtained size of the recess 211, for instance the depth, may be controlled on the basis of the etch time for otherwise fixed process conditions, wherein, due to the enhanced uniformity of the previous progression of the etch process 210, a significantly enhanced uniformity for the cavities 211 across the substrate 201 and between different substrates may be achieved.

Moreover, in some illustrative embodiments, the process 210 as shown in FIGS. 2a-2d may be performed as an in situ process. Hence, the cycle time for forming the recesses 211 may be significantly reduced due to the omission of specific process steps required in the conventional technique, such as wet chemical cleaning processes, measurement of the remaining oxide liner 107 and the like, wherein, additionally, due to the in situ nature of the process 210, substrate handling and transportation processes may be avoided or at least significantly reduced, thereby also increasing the tool utilization. In still other embodiments, when the process 210 as shown in FIGS. 2b and 2c for the common patterning of the layers 207 and 206 is performed as an in situ process, i.e., as a common etch process, a significant improvement may still be achieved even if subsequent processes may be performed as separate etch process steps, since a high degree of process uniformity may still be provided by the initial phase of the process 210 for patterning the sidewall spacers 206A.

With reference to FIGS. 3a-3e, further illustrative embodiments of the present invention will now be described in which an in situ etch process may be used, such as the process 210 as previously described, in order to provide different recesses and/or different strained semiconductor materials or other semiconductor materials of different characteristics for different transistor types.

Figure 3A:
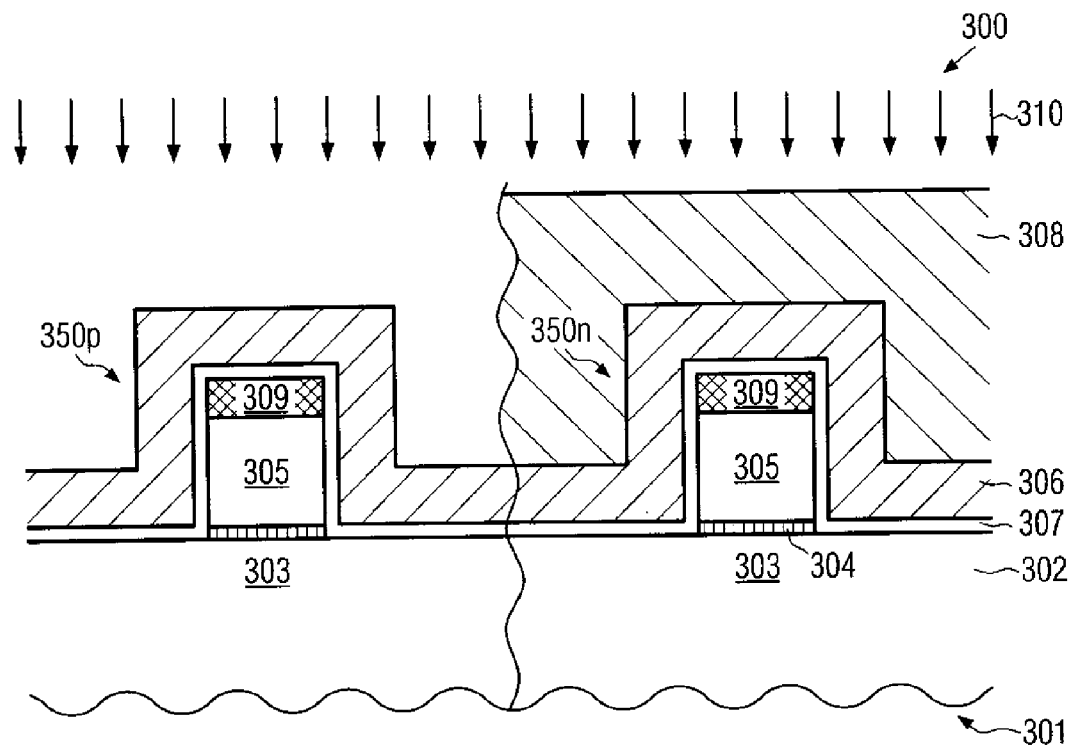
FIGS. 3a-3e schematically illustrate cross-sectional views of a semiconductor device during various manufacturing stages for the formation of different strained semiconductor materials in different transistor types based on an in situ patterning process according to yet other illustrative embodiments of the present invention.

FIG. 3a schematically illustrates a cross-sectional view of a semiconductor device 300 comprising a first transistor 350p and a second transistor 350n formed above a substrate 301 comprising a semiconductor layer 302. Each of the transistors 350p, 350n may comprise a gate electrode 305 formed above a respective channel region 303 and separated therefrom by a respective gate insulation layer 304. Moreover, respective capping layers 309 may be formed on top of the gate electrode 305. Moreover, a layer stack including, for instance, a liner 307 and a spacer layer 306 may be formed so as to enclose the first and second transistors 350p, 350n. Furthermore, a resist mask 308 may be formed on the device 300 so as to expose the first transistor 350p while covering the second transistor 350n. With respect to the components described so far, the same criteria apply as previously explained with respect to the devices 100 and 200. It should be appreciated, however, that with respect to the liner 307 and the spacer layer 306 as well as the capping layers 309, i.e., regarding process margins and characteristics, it may be referred to the components 207, 206 and 209.

For a respective process flow for forming the device 300 as shown in FIG. 3a, it is referred to the corresponding processes as described with reference to the device 200. Moreover, in this manufacturing stage, the device 300 is subjected to an etch process 310, which, in one illustrative embodiment, is designed as an in situ process for forming sidewall spacers and a respective recess in the first transistor 350p, wherein the etch process 310 may have substantially the same characteristics as previously described for the process 210. That is, in an initial phase of the process 310, a respective anisotropic etch ambient may be established which exhibits a high degree of directionality and etch uniformity, whereas a significant selectivity between the layers 306 and 307 may not be necessary. In a subsequent phase of the process 310, the resist mask 308 may be removed, for instance on the basis of a respective plasma-based etch process, wherein polymer materials deposited on respective chamber walls and other surfaces exposed during the process 310 for patterning respective sidewall spacers are also liberated, thereby enhancing the efficiency of the resist strip process, as is previously explained. In a next phase, a corresponding plasma-based cleaning process, which may have a high selectivity with respect to the capping layer 309 and exposed portions of the semiconductor layer 302, may be performed and thereafter the semiconductor layer 302 may be etched.

Figure 3B:
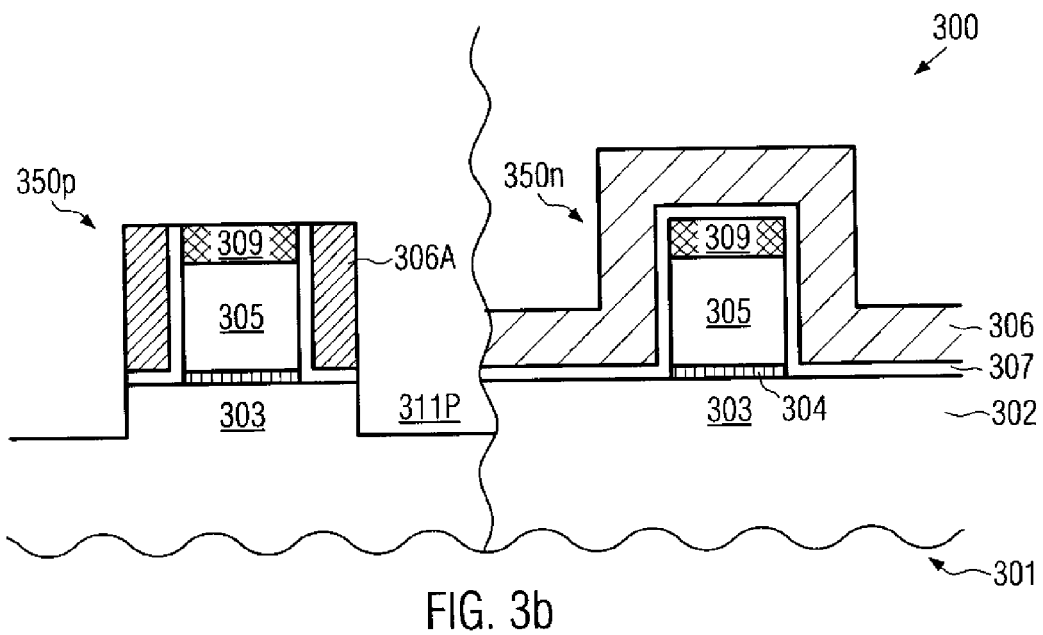

FIG. 3b schematically illustrates the semiconductor device 300 after the completion of the in situ etch process 310. Hence, respective spacers 306A are formed at sidewalls of the gate electrode 305 and a respective recess 311P is formed in the first transistor 350p, while the second transistor 350n is covered by the liner 307 and the spacer layer 306. Similarly as is explained above with reference to the device 200, the cavity 311P may have significantly enhanced characteristics with respect to surface roughness as well as etch depth uniformity across the substrate 302.

Next, the device 300 may be subjected to a selective epitaxial growth process, during which the spacer 306A and the capping layer 309 in the first transistor 350n provide the required encapsulation of the gate electrode 305, while the second transistor is reliably covered by the layers 306 and 307. For instance, any appropriate semiconductor material may be grown, such as a strained silicon/germanium material, a silicon/carbon material and the like, depending on the requirements of the transistor 350p. For example, if the transistor 350p represents a P-channel transistor, a compressively strained semiconductor material may be formed during the selective epitaxial growth process. Thereafter, the layer 306 above the second transistor 350n may be removed on the basis of a selective etch process, for instance on the basis of a wet chemical process using hot phosphoric acid when the layer 306 is comprised of silicon nitride. During this removal process, the spacer 306A and the capping layer 309 of the first transistor 350p may also be removed.

Figure 3C:
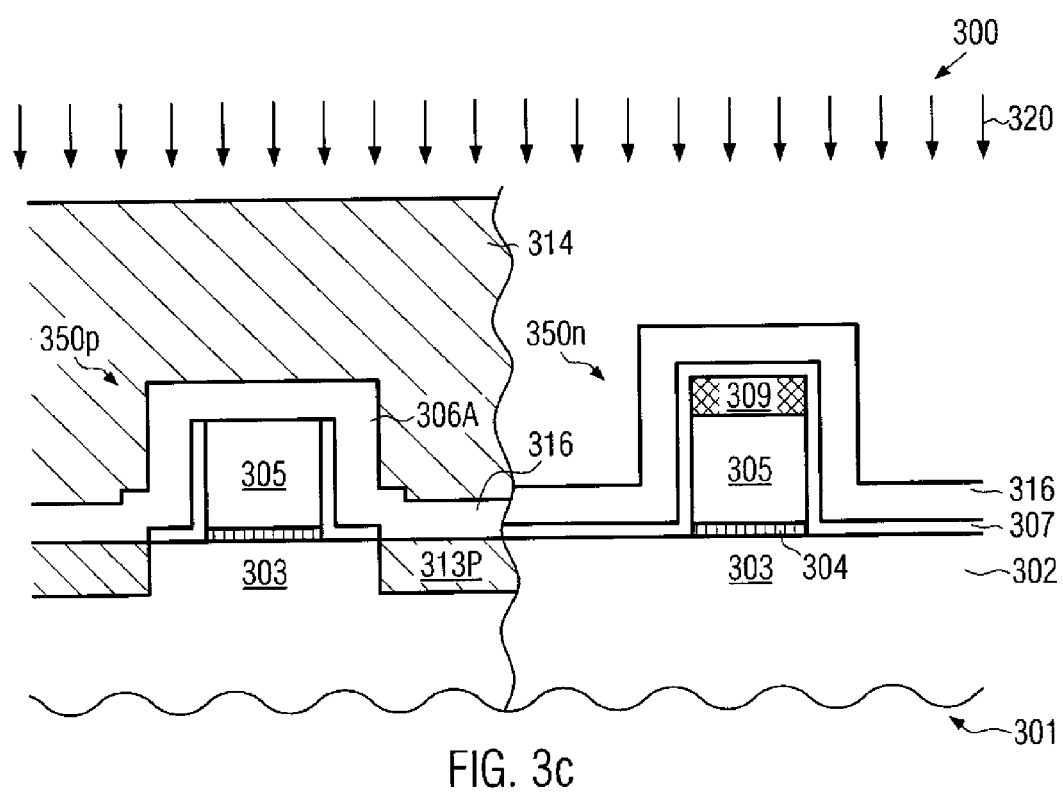

FIG. 3c schematically illustrates the semiconductor device 300 after the completion of the above-described process sequence in a further advanced manufacturing stage. The device 300 comprises a second spacer layer 316, for instance comprised of silicon nitride, formed above the first and second transistors 350p, 350n. Moreover, a resist mask 314 is formed to cover the first transistor 350p while exposing the second transistor 350n. Moreover, the device 300 is subjected to a further etch process 320, which may be designed similar to the processes 310 and 210, i.e., in some illustrative embodiments, the process 320 may be designed as an in situ process for forming sidewall spacers at the gate electrode of the second transistor 350n and also for forming respective recesses.

Figure 3D:
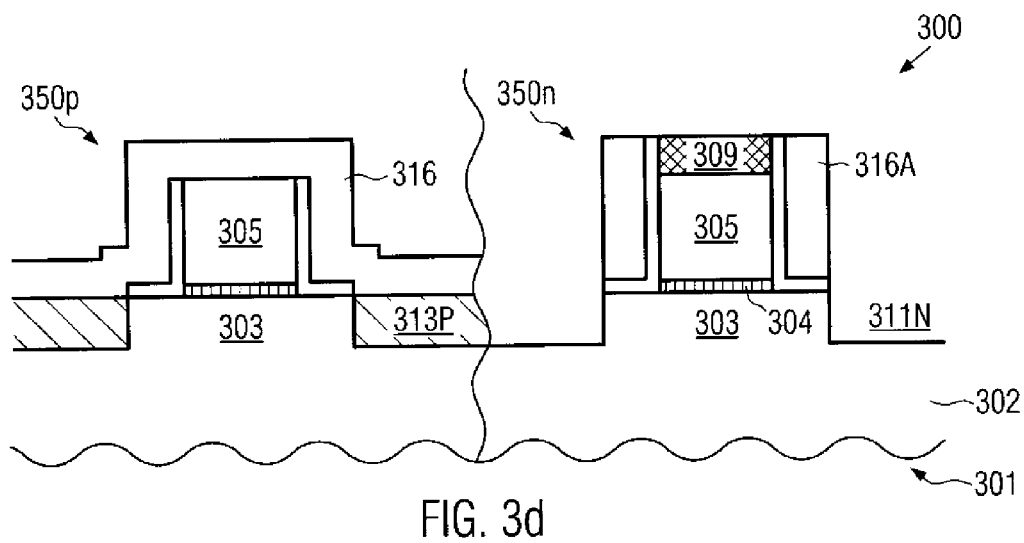

FIG. 3d schematically illustrates the device 300 after the completion of the in situ etch process 320, and hence the second transistor 350n comprises a respective recess 311N as well as respective spacers 316A formed on sidewalls of the gate electrode 305. It should be appreciated that the recess 311N may differ from the respective recess 311P in shape and/or size, depending on the characteristics of the etch process 320 and the thickness of the spacer layer 316. For example, if an increased offset of the recess 311N with respect to the corresponding channel region 303 is required, the spacer layer 316 may be provided with an increased thickness. Moreover, if a different shape and/or depth of the recess 311N compared to the recess 311P is required, the corresponding phase of the in situ etch process 320 for etching into the semiconductor layer 302 may be correspondingly adjusted, for instance by selecting a different etch time, a different degree of anisotropy and the like, based on process parameters as previously explained with reference to the etch process 210.

Thereafter, a further selective epitaxial growth process may be performed, wherein the second spacer layer 316 reliably covers the first transistor and the previously grown semiconductor material 313P, while the gate electrode of the second transistor 305 is reliably encapsulated by the capping layer 309 and the spacer 316A.

Figure 3E:
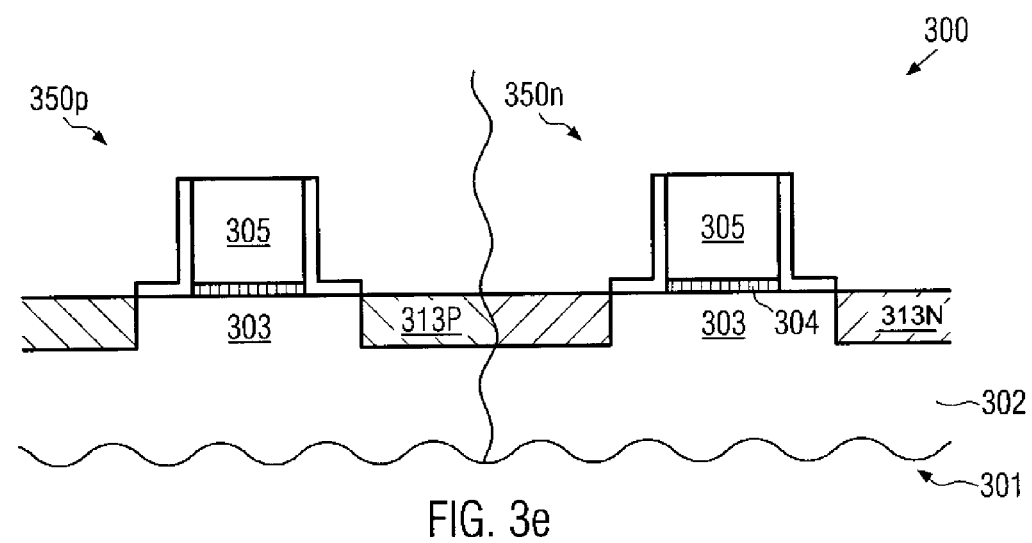

FIG. 3e schematically illustrates a device in a further advanced manufacturing stage in which, after the second epitaxial growth process, resulting in a corresponding semiconductor material 313N, which may represent a strained semiconductor material in accordance with device requirements of the transistor 350n, the second spacer layer 316 and the spacers 316A and the capping layer 309 are removed. For instance, highly selective wet chemical etch processes may also be used in this case. Thereafter, further manufacturing processes may be performed in order to complete the first and second transistor elements 350p, 350n. Consequently, a highly efficient process flow for manufacturing different types of transistors, which may receive different types of embedded semiconductor material, such as material of different type and magnitude of strain, may be achieved on the basis of the in situ etch processes 310 and 320, wherein a high degree of flexibility is also provided, since the formation of the recesses 311P and 311N is decoupled from each other, thereby allowing an independent adjustment of the respective characteristics of the semiconductor materials 313P, 313N, while the characteristics of the in situ etch processes 310, 320 provide reduced complexity and enhanced uniformity.

With reference to FIGS. 4a-4e, further illustrative embodiments of the present invention will now be described in which an even reduced process complexity is achieved by avoiding at least one lithography step for forming resist masks.

Figure 4A:
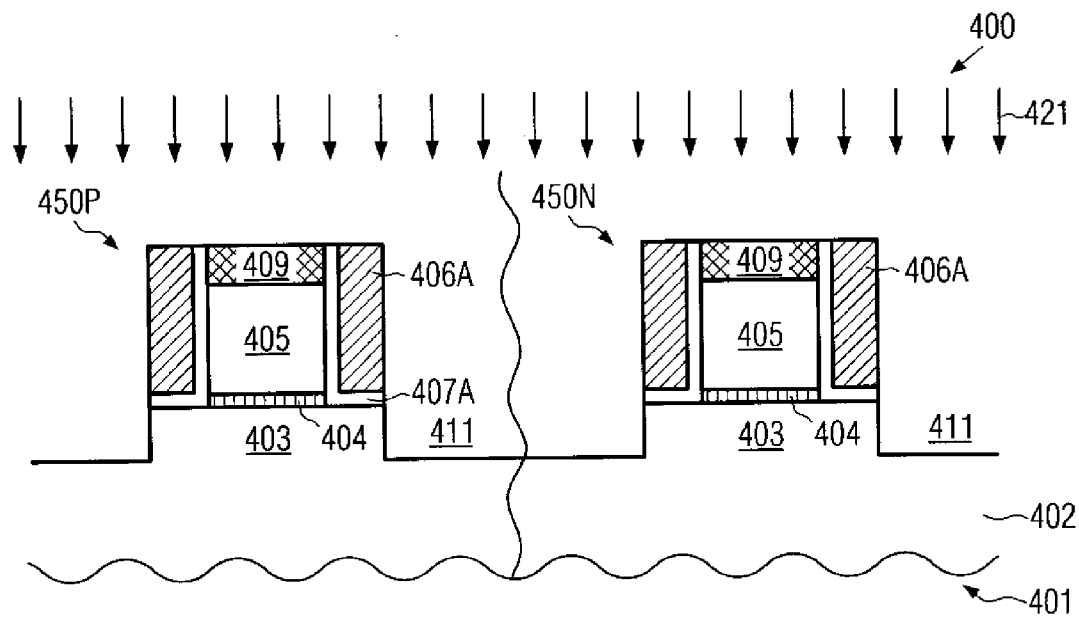
FIGS. 4a-4e schematically illustrate cross-sectional views of a semiconductor device during various manufacturing stages for the formation of different strained semiconductor materials based on an in situ patterning process according to yet other illustrative embodiments.

FIG. 4a schematically illustrates a semiconductor device 400 in an advanced manufacturing stage. Here, the device 400 comprises a first transistor 450P and a second transistor 450N, each comprising respective gate electrodes 405 having formed thereon respective spacers 406A, which may be comprised of silicon dioxide and which may be separated from the gate electrode 405 by a liner 407A, for instance comprised of silicon nitride. Furthermore, respective capping layers 409, comprised of silicon nitride and the like, may be provided on top of the respective gate electrodes 405. The transistors 450P, 450N may be formed above a substrate 401 including an appropriate semiconductor layer 402. With respect to the components 401, 402, 405 and 409, the same criteria apply as previously explained with reference to the devices 200 and 300.

A typical process flow for forming the device 400 as shown in FIG. 4a may comprise the following processes. The gate electrode 405 including the capping layers 409 may be formed on the basis of processes as previously described. Thereafter, a liner material, such as silicon dioxide, may be deposited, followed by the deposition of a spacer layer, for instance comprised of silicon nitride. Respective deposition techniques are well established in the art. Next, an in situ etch process may be performed, for instance in a similar fashion as described with reference to the processes 210 and 310, in order to form the spacer elements 406A and etch the recesses 411. As is previously explained, the etch processes 210, 310, 320 may be designed so as to have none or only a reduced selectivity in view of materials such as silicon dioxide, silicon nitride and the like, wherein, however, an enhanced process uniformity is achieved. Consequently, similar process parameters may also be used for etching the corresponding spacer layer, which may be comprised of silicon dioxide, and subsequently the liner 407A, which may be comprised of silicon nitride. Thereafter, the in situ etch process may be continued as is previously described. Since the first and second transistors 450P, 450N are subjected to the in situ etch process simultaneously, a resist mask and a corresponding photolithography process may be avoided, while at the same time an even enhanced process uniformity may be achieved due to a more uniform pattern density across the substrate 401.

Figure 4B:
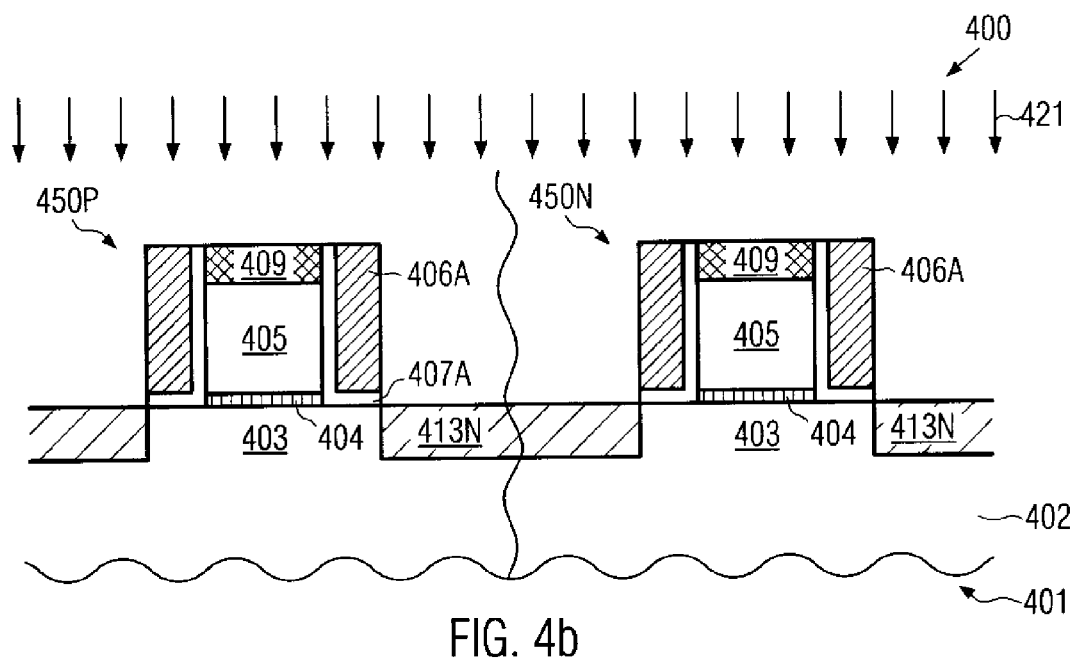

FIG. 4b schematically illustrates the device 400 during a selective epitaxial growth process 421, thereby forming a respective semiconductor material 413N in the recesses 411 of the first and second transistors 450P, 450N. For example, the material 413N may represent a strained semiconductor material comprising a compressive or tensile strain, depending on the further process strategy.

Figure 4C:
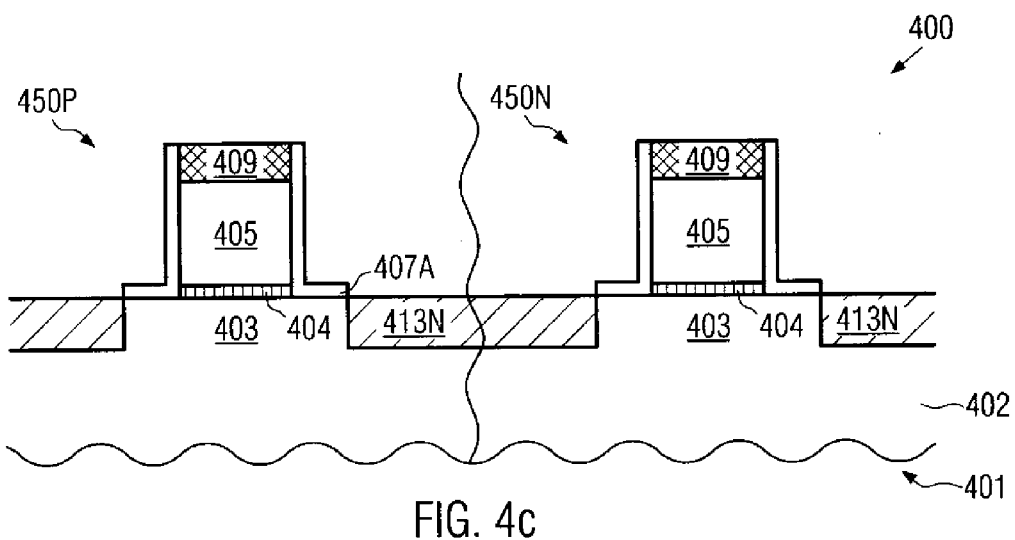

FIG. 4c schematically illustrates the device 400 after the selective removal of the spacer elements 406A on the basis of, for instance, a highly selective wet chemical etch process such as an etch process on the basis of hydrofluoric acid (HF) based on well-established recipes.

Figure 4D:
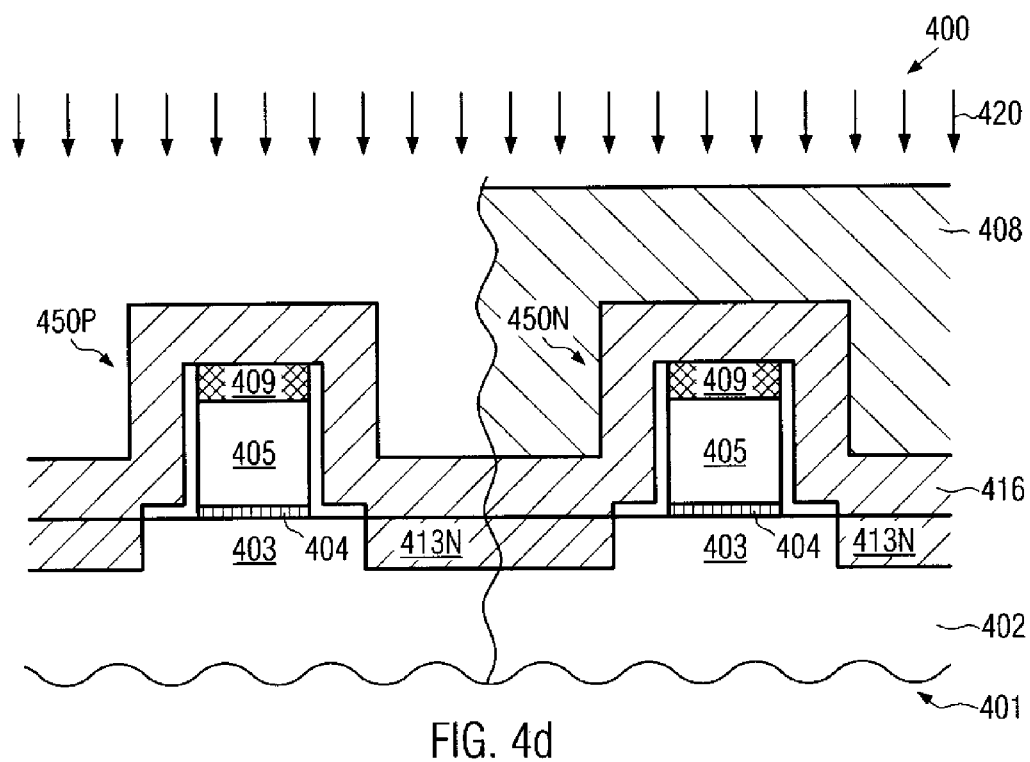

FIG. 4d schematically illustrates the device 400 in an advanced manufacturing stage in which a further spacer layer 416, comprised of, for instance, silicon dioxide, may be formed above the first and second transistors 450P, 450N. Moreover, a resist mask 408 may be formed so as to cover the second transistor 450N while exposing the first transistor 450P to an in situ etch process 420, which may be designed similarly to the etch process 410 in order to form respective spacer elements on the first transistor 450P and also for etching into the semiconductor material 413N in the first transistor 450P.

Figure 4E:
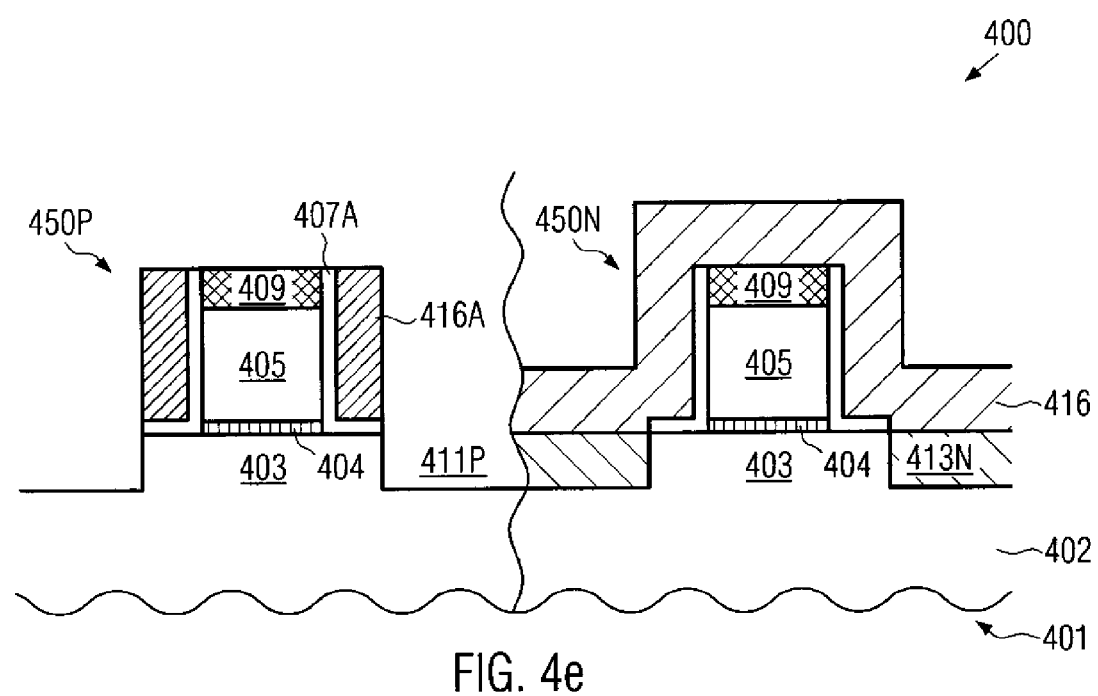

FIG. 4e schematically illustrates the device 400 after the completion of the in situ etch process 420, wherein respective sidewall spacers 416A and a recess 411P is formed at the first transistor 450P, while the second transistor 450N is still reliably covered by the remaining spacer layer 416. It should be appreciated that the recess 411P may not necessarily have the same depth or shape since the etch process 420, i.e., the phase for etching into the material 413N, may be appropriately designed in order to provide a required shape and depth. For instance, if an increased depth or a different degree of "under-etching" is required, the corresponding process parameters, as previously explained, may be appropriately adjusted in order to obtain the desired etch result. Thereafter, the further processing may be continued by performing a second selective epitaxial growth process for forming a respective semiconductor material in the recess 411P, which may have different characteristics compared to the material 413N. Next, the spacers 416A and the remaining layer 416 may be removed and thereafter the capping layers 409 and the liners 407A may be removed. In some illustrative embodiments, a thin oxide liner may be provided at the sidewalls of the gate electrodes 405, for instance formed by oxidation prior to the formation of the liner 407A, thereby substantially reducing any negative impact on the gate electrodes 405 during the removal of the liners 407A. Consequently, a highly efficient process flow for forming different types of epitaxially grown semiconductor materials on the basis of respective in situ etch processes is provided, wherein the formation of at least one resist mask may be omitted, while nevertheless a high degree of process uniformity and flexibility is accomplished.

As a result, the present invention provides a technique that provides enhanced process uniformity with reduced complexity during the formation of respective cavities and sidewall spacers required for the formation of embedded semiconductor materials, such as strained semiconductor materials. For this purpose, an in situ etch process is performed in which several etch steps are combined and may be performed in a single etch chamber, thereby also increasing tool utilization and thus production efficiency. Furthermore, the in situ etch process may be used for the formation of different types of embedded semiconductor material, thereby eliminating the necessity or at least reducing the effort for lithographically patterned hard masks, which may significantly contribute to process flow efficiency. At the same time, a high degree of process uniformity and thus device uniformity may be achieved due to the superior characteristics of the in situ etch process compared to a conventional process requiring a plurality of separate etch processes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a spacer layer above a semiconductor layer so as to cover a gate electrode of a transistor, said gate electrode being formed above said semiconductor layer and having formed on a top surface thereof a capping layer;
   performing a sequence of in situ etch processes for etching said spacer layer and said semiconductor layer to form sidewall spacers on sidewalls of said gate electrode and a recess in said semiconductor layer adjacent to said sidewall spacers;
   forming a resist mask for covering a second transistor and exposing said first transistor prior to performing said in situ etch process; and
   forming a strained semiconductor material in said recess.

2. The method of claim 1, wherein said in situ etch process comprises a first anisotropic etch phase for etching said spacer layer, said first etch phase being stopped upon exposing said semiconductor layer.

3. The method of claim 2, wherein said in situ etch process comprises a cleaning phase after exposing said semiconductor layer, said cleaning phase performed on the basis of an etch chemistry having a high etch selectivity with respect to said sidewall spacers, said capping layer and said exposed semiconductor layer.

4. The method of claim 3, wherein said in situ etch process further comprises a second etch phase for removing material of said exposed semiconductor layer selectively to said sidewall spacer and said capping layer.

5. The method of claim 4, wherein a lateral extension of said recess is controlled by adjusting a degree of anisotropy in said second etch phase on the basis of at least one of an ion flux density and a ratio of reactive halide to a passivation generator.

6. The method of claim 5, wherein said ion flux density is controlled on the basis of at least one of a pressure and a bias power of a plasma ambient used in said second etch phase.

7. The method of claim 2, wherein said first etch phase is performed on the basis of a fluorine and passivation generator containing plasma etch ambient.

8. The method of claim 2, wherein forming said spacer layer comprises forming a first sub-layer having a first thickness directly formed on said sidewalls of said gate electrode and on an exposed portion of said semiconductor layer, and forming a second sub-layer having a second thickness on said first sub-layer, said first thickness being less than said second thickness.

9. The method of claim 8, wherein said first thickness ranges from approximately 1-10 nm.

10. The method of claim 1, wherein said resist mask is removed during said in situ etch process.

11. A method, comprising:
    forming a first recess and a first sidewall spacer adjacent to a gate electrode of a first transistor of a first type by a first in situ etch process;
    forming a second recess and a second sidewall spacer adjacent to a second gate electrode of a second transistor of a second type, said second type being different from said first type, wherein said second sidewall spacer and said second recess are formed during said first in situ etch process;
    forming a first semiconductor material in said first recess; and
    forming a second semiconductor material in said second recess, wherein said first and second semiconductor materials are formed in a common epitaxial growth process.

12. The method of claim 11, wherein said second sidewall spacer and said second recess are formed by a second in situ etch process other than said first in situ etch process.

13. The method of claim 12, wherein said first recess and sidewall spacer are formed prior to forming said second recess and said second sidewall spacer, and said first semiconductor material is formed prior to forming said second recess and said second sidewall spacer.

14. The method of claim 13, wherein forming said second sidewall spacer and said second recess comprises removing a first spacer layer located above said second transistor, said first spacer layer being used for forming said first sidewall spacer and said first recess, and forming a second spacer layer to form said second sidewall spacer during said second in situ etch process.

15. The method of claim 11, further comprising removing said first and second sidewall spacers, forming a spacer layer above said first and second transistors, selectively forming a third sidewall spacer adjacent to said first gate electrode and removing said first semiconductor material from said first recess by a third in situ etch process and forming a third semiconductor material in said first recess.

16. A method, comprising:
   forming a spacer layer stack including at least two different material layers above a semiconductor layer so as to cover a gate electrode of a transistor, said gate electrode being formed above said semiconductor layer and having formed on a top surface thereof a capping layer;
   forming a sidewall spacer on a sidewall of said gate electrode by etching said spacer layer stack in a common an isotropic etch process based on a first plasma-based etch ambient;
   forming a recess adjacent to said gate electrode on the basis of said sidewall spacer; wherein forming said recess comprises establishing a second plasma-based etch ambient having a higher etch rate for said semiconductor layer compared to said spacer layer stack; and
   epitaxially forming a semiconductor material in said recess.

17. The method of claim 16, further comprising cleaning an exposed portion of said semiconductor layer on the basis of a cleaning process prior to establishing said second etch ambient, said cleaning process being based on an etch chemistry that has a reduced etch rate with respect to the exposed semiconductor layer and with respect to the spacer layer stack and said capping layer.

18. The method of claim 17, wherein said first and second etch ambients and said etch chemistry for said cleaning process are established in situ.

19. A method, comprising:
   forming a spacer layer above a semiconductor layer so as to cover a gate electrode of a transistor, said gate electrode being formed above said semiconductor layer and having formed on a top surface thereof a capping layer, wherein forming said spacer layer comprises forming a first sub-layer having a first thickness directly formed on said sidewalls of said gate electrode and on an exposed portion of said semiconductor layer, and forming a second sub-layer having a second thickness on said first sub-layer, said first thickness being less than said second thickness;
   performing a sequence of in situ etch processes for etching said spacer layer and said semiconductor layer to form sidewall spacers on sidewalls of said gate electrode and a recess in said semiconductor layer adjacent to said sidewall spacers, wherein said in situ etch process comprises a first an isotropic etch phase for etching said spacer layer, said first etch phase being stopped upon exposing said semiconductor layer; and
   forming a strained semiconductor material in said recess.

* * * * *